US007786467B2

(12) United States Patent
Williams et al.

(10) Patent No.: US 7,786,467 B2
(45) Date of Patent: Aug. 31, 2010

(54) THREE-DIMENSIONAL NANOSCALE CROSSBARS

(75) Inventors: R. Stanley Williams, Portola Valley, CA (US); Philip J. Kuekes, Menlo Park, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1186 days.

(21) Appl. No.: 11/114,307

(22) Filed: Apr. 25, 2005

(65) Prior Publication Data

US 2006/0240681 A1    Oct. 26, 2006

(51) Int. Cl.
*H01L 31/00* (2006.01)
(52) U.S. Cl. .................. 257/17; 257/12; 977/762; 977/767
(58) Field of Classification Search .......... 257/12, 257/183, 200, E29.07, 17; 977/762, 763, 977/700, 767
See application file for complete search history.

(56) References Cited

U.S. PATENT DOCUMENTS 6,297,063 B1 * 10/2001 Brown et al. .................. 438/2
6,340,822 B1 * 1/2002 Brown et al. .................. 257/25
7,274,208 B2 * 9/2007 DeHon et al. .................. 326/38
2006/0081989 A1 * 4/2006 Uang et al. .................. 257/753

FOREIGN PATENT DOCUMENTS

WO    WO03/063208    7/2003
WO    WO03/100789    12/2003
WO    WO2004/034467    4/2004

OTHER PUBLICATIONS

Hewlett-Packard Development Company, L.P., KR 2007-7024484 (co-pending application), English Translation of Nov. 26, 2009 Notice of Preliminary Rejection issued by KIPO.

* cited by examiner

*Primary Examiner*—Thao X Le
*Assistant Examiner*—Thanh Y Tran

(57) ABSTRACT

Various embodiments of the present invention include three-dimensional, at least partially nanoscale, electronic circuits and devices in which signals can be routed in three independent directions, and in which electronic components can be fabricated at junctions interconnected by internal signal lines. The three-dimensional, at least partially nanoscale, electronic circuits and devices include layers, the nanowire or microscale-or-submicroscale/nanowire junctions of each of which may be economically and efficiently fabricated as one type of electronic component. Various embodiments of the present invention include nanoscale memories, nanoscale programmable arrays, nanoscale multiplexers and demultiplexers, and an almost limitless number of specialized nanoscale circuits and nanoscale electronic components.

6 Claims, 10 Drawing Sheets

THREE-DIMENSIONAL NANOSCALE CROSSBARS

STATEMENT OF GOVERNMENT INTEREST

This invention has been made with Government support under Agreement #MDA972-01-3-005, awarded by DARPA Moletronics. The government has certain rights in the invention.

TECHNICAL FIELD

The present invention relates to electronic devices and circuits, and, in particular, to nanoscale, hybrid nanoscale/microscale, and hybrid nanoscale/submicroscale devices and circuits with three independent dimensions in which signal paths may be routed, and in which electronic components can be fabricated at junctions interconnected by internal signal lines.

BACKGROUND OF THE INVENTION

Recently, as the design and manufacture of electronic devices and circuits by conventional, photolithography-based methods has begun to approach physical limits to further decreases in component sizes, alternative methods for manufacturing nanoscale electronic circuits have been developed. Nanowire-crossbar technology is a particularly promising new approach to fabrication of electronic circuits and devices with dimensions significantly less than, and component densities correspondingly greater than, the submicroscale circuits and components that can be currently produced by photolithographic methods.

FIG. 1 illustrates an exemplary nanowire crossbar. The nanowire crossbar in FIG. 1 implements a simple memory device. The nanowire crossbar comprises: (1) a first set of parallel nanowires 102; (2) a bistable bit-storage layer 104; and (3) a second layer of parallel nanowires 106 perpendicular to the first layer of parallel nanowires 102. A single bit of information is stored within each small region of the bit-storage layer 104 at each point of minimal separation, or intersection, between a nanowire of the first layer of nanowires 102 and a nanowire of the second layer of nanowires 106. For example, the small region 108 of the bit-storage layer 104, shown crosshatched in FIG. 1, that overlies nanowire 110 and underlies nanowire 112, forms, along with the portions of nanowires 110 and 112 in contact with the small region, a nanowire junction that serves as a single-bit storage element 114 within the nanoscale memory. In many nanoscale-memory embodiments, the contents of a single-bit storage element, such as single-bit storage element 114 in FIG. 1, are modified by applying voltage or current signals to one or both of the nanowires that intersect to form the single-bit storage element in order to change a physical state of the bistable bit-storage layer within the nanowire junction, such as the resistivity. In FIG. 1, for example, signals may be applied to one or both of nanowires 110 and 112 to modify single-bit storage element 114, as indicated in FIG. 1 by arrows, such as arrow 116. Generally, no signal, or a different signal, is applied to the remaining nanowires to distinguish the addressed single-bit storage element from all other single-bit storage elements. In many embodiments, signals of relatively large magnitude are applied to carry out WRITE operations, in which a physical state is changed, while relatively smaller magnitude signals are applied to carry out READ operations, in which the physical state is generally not changed, but instead merely determined. In READ operations, a physical state of a single-bit storage element is determined, from the presence, absence, or strength of a signal on one or both of the two nanowires that intersect to form the single-bit storage element, by applying one or more signals to nanowires of the nanowire crossbar. Nanoscale memories implemented by nanowire crossbars can be thought of as two-dimensional arrays of single-bit storage elements, each single-bit storage element separately and uniquely addressable through the two nanowires that intersect to form the single-bit storage element. In certain cases, entire rows, columns, or larger groups of single-bit storage elements within a two-dimensional nanoscale memory can be accessed in a single operation.

FIG. 1 provides a simple, schematic illustration of an exemplary nanowire crossbar. Although individual nanowires in FIG. 1 are shown with rectangular cross sections, nanowires can also have circular, ellipsoid, or more complex cross sections, and nanowires may have many different widths or diameters and aspect ratios or eccentricities. Nanowires can be fabricated using imprint lithography, by chemical self-assembly on surfaces and transfer to substrates, by chemical synthesis in place, and by a variety of other techniques from metallic and/or semiconducting elements or compounds, doped organic polymers, composite materials, nanotubes, and doped nanotubes, and from many additional types of conductive and semiconducting materials. The bistable bit-storage layer 104 is shown in FIG. 1 as a continuous layer between two sets of parallel nanowires, but may alternatively be discontinuous, or may constitute sheath-like molecular coatings around, or component atoms or molecules within, the nanowires, rather than a separate layer. The bistable bit-storage layer 104 may also be composed of a wide variety of different metallic, semiconducting, doped polymeric, and composite materials.

The two-dimensional-matrix-like nanoscale memory, shown in FIG. 1, is among the most simple types of electronic devices that can be implemented using nanowire crossbars. Nanowire crossbars can also be used to implement programmable logic arrays, multiplexers and demultiplexers, and an almost limitless number of different, specific electronic circuits. In a nanoscale memory, the bistable bit-storage layer can be homogeneous, with each nanowire junction functioning as a diode, for example, but in more complex devices, numerous, different types of electronic components may need to be implemented at different nanowire junctions. Various techniques can be used to create these different electronic components, such as diodes, resistors, transistors, and conductive connections, including chemical masking of regions within a crossbar in order to fabricate one type of electronic component at the nanowire junctions in each region, or by nondeterministic self-assembly or fabrication of different types of nanowires, with different chemical coatings, followed by testing and experimentation to discover and elaborate the types and locations of resulting electronic components within a resulting crossbar. These techniques, and additional techniques, for varying the types of nanowire junctions within a nanowire crossbar may add significant complexity and expense to nanowire-crossbar manufacture, and may significantly decrease the yield of acceptable devices. Moreover, they are generally limited to partitioning an essentially two-dimensional device into smaller, two-dimensional partitions, each of which includes a potentially different type of electronic component, or junction.

Significant problems are encountered with respect to interconnection of individual nanowire leads of a nanowire crossbar to submicroscale and microscale signal lines in order to incorporate the nanowire crossbar into conventional electronic devices, including identifying and manipulating individual nanowires. One solution to these problems is to employ demultiplexers with microscale or submicroscale address lines that are integrated with nanowire crossbars. FIG. 2 shows a nanowire-crossbar memory integrated with nanoscale/microscale demultiplexers to allow individual bit-storage elements of the nanowire-crossbar memory to be uniquely accessed via microscale or submicroscale address lines. In FIG. 2, a 16×16 nanowire crossbar 202 has parallel-nanowire layers in which nanowires are extended past the boundaries of the nanowire-crossbar array 202 to form a first demultiplexer 204 and a second demultiplexer 206. Demultiplexer 204 comprises the extended nanowires from a first parallel-nanowire layer of the nanowire crossbar, such as nanowire 208, overlain or underlain by a perpendicular, microscale or submicroscale source-voltage line 210 and four pairs 212-215 of perpendicular microscale or submicroscale address lines. The second demultiplexer 206 is similarly implemented from the extended nanowires of the second parallel-nanowire layer of the nanowire crossbar. In certain types of implementations, such as the implementation shown in FIG. 2, address lines occur as complementary pairs, each pair representing one bit, an its inverse, of a multi-bit address, while in other implementations, single address lines may be used. Four-bit address input through the four pairs of address lines 212-215 are sufficient to provide a unique address for each of the 16 nanowires, such as nanowire 208, and two four-bit addresses input simultaneously to the four pairs of address lines of each of the two demultiplexers 204 and 206 can uniquely address a particular nanowire junction from among the 256 nanowire junctions within the nanoscale-crossbar array 202. The electronic components at submicroscale-or-microscale-address-line/nanowire junctions within the demultiplexers may be resistors, diodes, or transistors, depending on the type of demultiplexer implemented, and on the operational characteristics of the demultiplexer desired. In general, in the case of a nanoscale memory device, such as that shown in FIG. 2, electronic components at submicroscale-or-microscale-address-line/nanowire junctions are different from the electronic components fabricated at nanowire junctions within the nanowire crossbar. Fabrication of the nanoscale memory shown in FIG. 2 may therefore involve masking and mask-alignment operations to chemically differentiate the demultiplexer regions from the nanowire crossbar, or other technique for fabricating one type of electronic component within the demultiplexer regions, and another type of electronic component within the nanowire crossbar. The memory device shown in FIG. 2 also has the significant drawback that the total area of the device is more than three times larger than that of the nanowire-crossbar. Moreover, the ratio of the total device area to the nanowire-crossbar area increases with increasing numbers of nanowires in the nanowire crossbar. For this reason, designers, manufacturers, vendors, and integrators of nanoscale electronic devices, as well as, ultimately, users of such devices, have recognized the need for nanowire crossbars and hybrid microscale/nanoscale crossbars that can be economically and efficiently manufactured with as great a component density as possible.

SUMMARY OF THE INVENTION

Various embodiments of the present invention include three-dimensional, at least partially nanoscale, electronic circuits and devices in which signals can be routed in three independent directions, and in which electronic components can be fabricated at junctions interconnected by internal signal lines. The three-dimensional, at least partially nanoscale, electronic circuits and devices include layers, the nanowire or microscale-or-submicroscale/nanowire junctions of each of which may be economically and efficiently fabricated as one type of electronic component. Various embodiments of the present invention include nanoscale memories, nanoscale programmable arrays, nanoscale multiplexers and demultiplexers, and an almost limitless number of specialized nanoscale circuits and nanoscale electronic components.

DETAILED DESCRIPTION OF THE INVENTION

Figure 2:
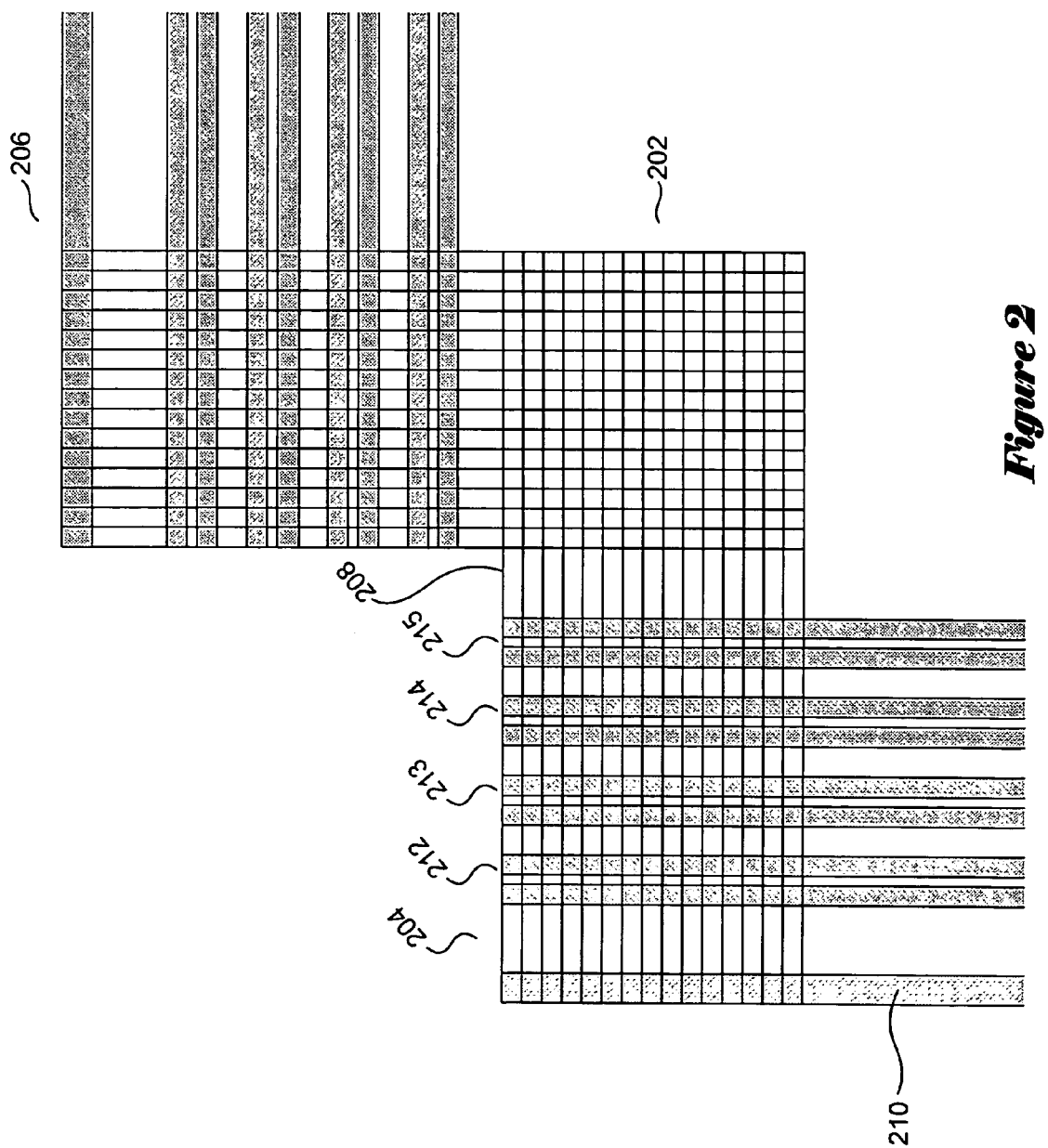
FIG. 2 shows a nanowire-crossbar memory integrated with nanoscale/microscale demultiplexers to allow individual bit-storage elements of the nanowire-crossbar memory to be uniquely accessed via microscale or submicroscale address lines.

Various embodiments of the present invention include three-dimensional nanoscale or hybrid nanoscale/microscale circuits and devices in which signals can be routed in three independent directions, and in which electronic components can be fabricated at junctions interconnected by internal signal lines. By building up these device layer-by-layer, in three dimensions, rather than spreading the device across two dimensions, the three-dimensional devices of the present invention can be more economically and efficiently manufactured. Vertical stacking of layers reduces the total area of the nanoscale component or device, and can lead to significantly shorter signal paths, for example eliminating the extended nanowires needed for implementation of the memory device discussed above with reference to FIG. 2. Decreasing signal paths through nanowires, which generally exhibit high resistivities, can greatly decrease the overall resistance and thermal output of a nanoscale electronic device or component. Different electronic components may be fabricated in each layer by applying different inter-layer coatings, without the need for complex, error-prone, and expensive masking and mask alignment procedures needed for fabrication of different types of electronic components in two-dimensional circuits and devices. Certain specialized types of components, such as cutter wires used to isolate subregions of a device from one another, can be fabricated together in single layers, vastly simplifying the identification and activation of such components. Finally, the degree of freedom in design and implementation afforded by a third, independent dimension may allow for design and fabrication of complex components and devices that either cannot be designed and fabricated in two dimensions, or that can be designed and fabricated in two dimensions only at unacceptable high costs.

The present invention concerns nanoscale crossbars and crossbar-like circuits and devices. These devices are nanoscale in that they include features, such as signal lines, with widths less than 100 nanometers, or, in certain cases, less than 10 nanometers, and, in the highest resolution circuits and devices, less than 5 nanometers. The devices may be dimensional hybrids, including larger components in addition to nanoscale components. The overall dimensions of these circuits and devices may be in submicroscale, microscale, or larger ranges. In the following discussion, he term "nanowire junction" refers to a junction at the intersection of a nanowire and another conductive component, such as a second nanowire, a submicroscale or microscale signal line, or other component of any of various dimensions. Thus, the term "nanowire junction."

One embodiment of the present invention is a nanoscale memory that interfaces through two demultiplexers to microscale or submicroscale address lines and source-voltage lines, equivalent to a nanoscale memory of the type discussed above with reference to FIG. 2. The three-dimensional, multilayer nanoscale memory that represents one embodiment of the present invention is discussed, below, as a step-wise implementation, although the three-dimensional nanoscale memory of the present invention is claimed without regard to specific implementation details. The step-wise discussion is used to clearly illustrate and distinguish the various layers of the three-dimensional nanoscale memory.

Figure 3:
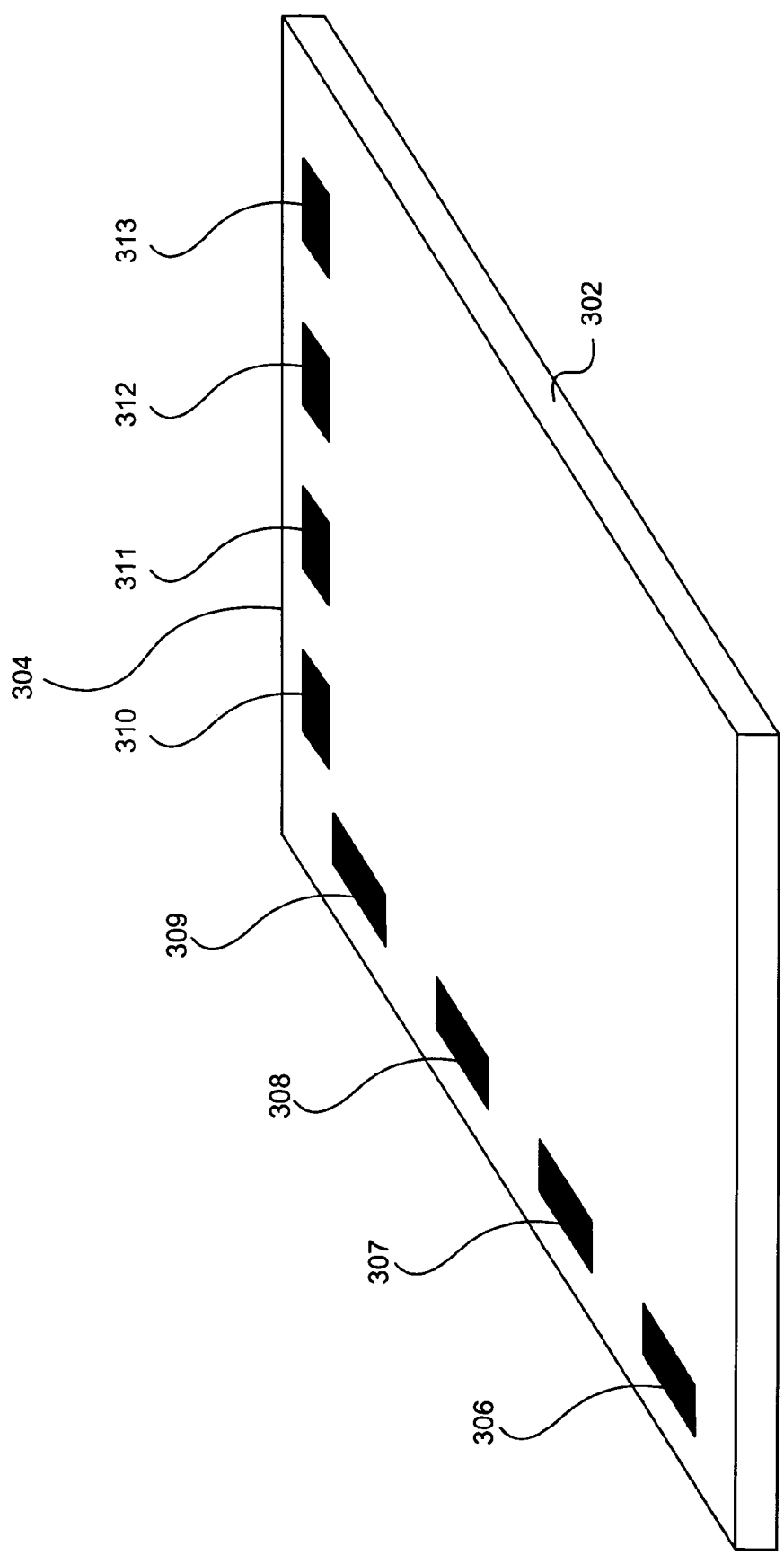
FIG. 3 shows a first layer in the three-dimensional nanoscale memory that represents one embodiment of the present invention.

FIG. 3 shows a first layer in the three-dimensional nanoscale memory that represents one embodiment of the present invention. The first layer 302 is a substrate, such as a standard silicon-dioxide-coated, silicon substrate used in conventional microscale or submicroscale integrated circuits. The three-dimensional memory that represents one embodiment of the present invention may be fabricated independently, for inclusion in larger devices or for standalone use, or may be fabricated within conventional circuitry, such as with an integrated circuit processor implementation, in order to enhance the conventional integrated circuit with extremely high-density, nanoscale memory. In general, the surface of the substrate 304 is planarized, and includes contact pads 306-313 to facilitate interconnection of external signal lines with source-voltage lines and address lines internal to the two demultiplexer layers within the three-dimensional nanoscale memory. The exemplary three-dimensional nanoscale memory discussed with reference to FIGS. 3-10, below, employs three address lines and one source-voltage line for each demultiplexer layer, therefore supporting three-bit addresses sufficient to uniquely address each of eight nanowires of a layer of parallel nanowires within a nanowire-crossbar memory, and sufficient for uniquely accessing any of 64 single-bit storage elements when two addresses are simultaneously input to each of the two demultiplexers. In certain implementations, a greater number of address lines and/or nanowires are included than minimally necessary in order to circumvent inevitable defects by having redundant nanowires and address lines available for post-manufacture configuration.

Figure 4:
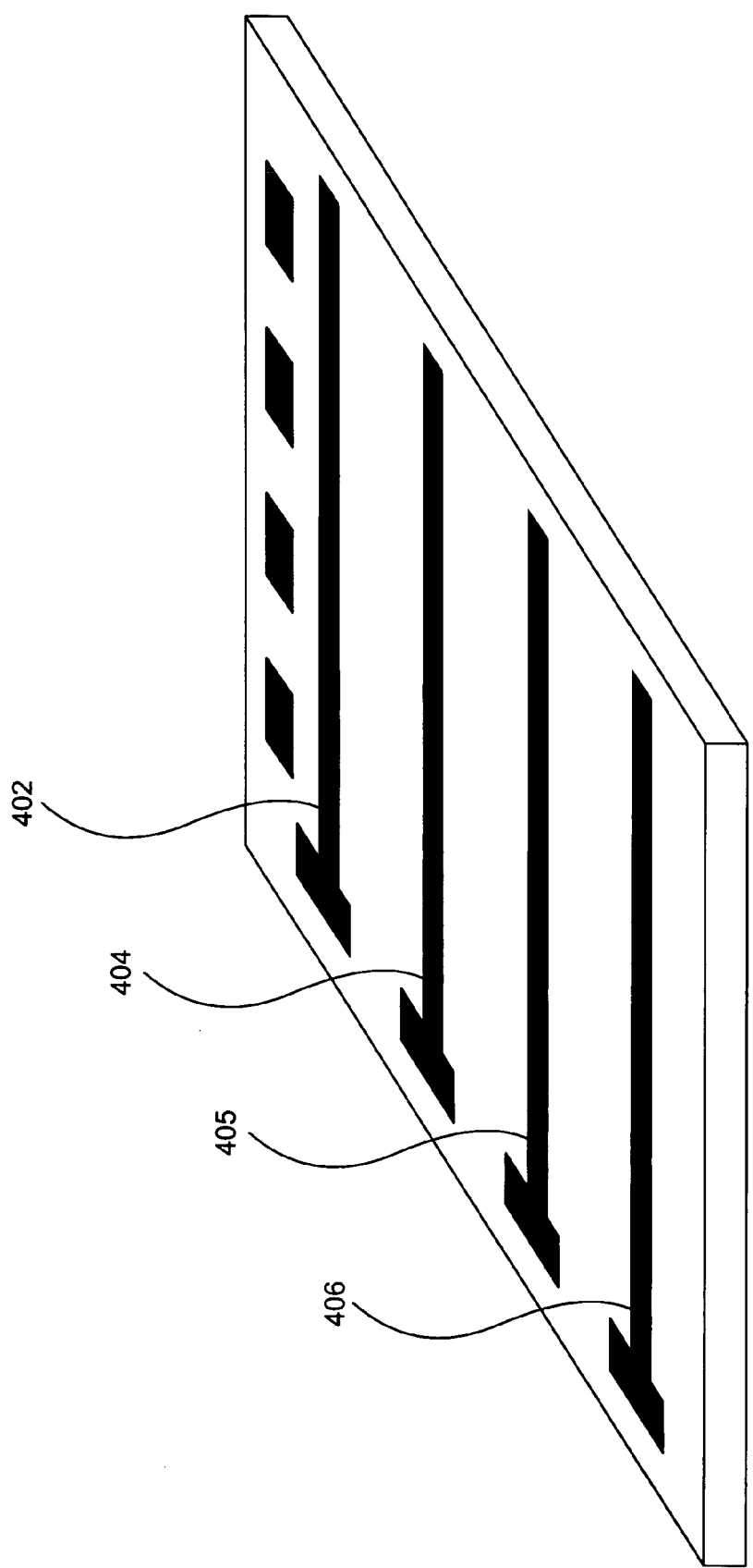
FIG. 4 shows a first wiring layer within the three-dimensional nanoscale memory that represents one embodiment of the present invention.

FIG. 4 shows a first wiring layer within the three-dimensional nanoscale memory that represents one embodiment of the present invention. As can be seen by comparing FIG. 4 to FIG. 3, a source-voltage line 402 and three address lines 404-406, all parallel with one another, have been laid horizontally across the surface of the substrate, each interconnected with a respective contact. The source-voltage line 402 and the three address lines 404-406 may be submicroscale or microscale signal lines fabricated by conventional photolithographic methods, or may be nanoscale lines fabricated by imprint lithography or a variety of other techniques. As with the two-dimensional nanoscale memory discussed with reference to FIG. 2, these microscale, submicroscale, or nanoscale lines, and other signal lines subsequently discussed, can be fabricated from any of many different types of elemental metals, from metallic or semiconducting compounds, from alloys, from doped organic polymers, or from a variety of other conductive or semiconducting materials.

Figure 5:
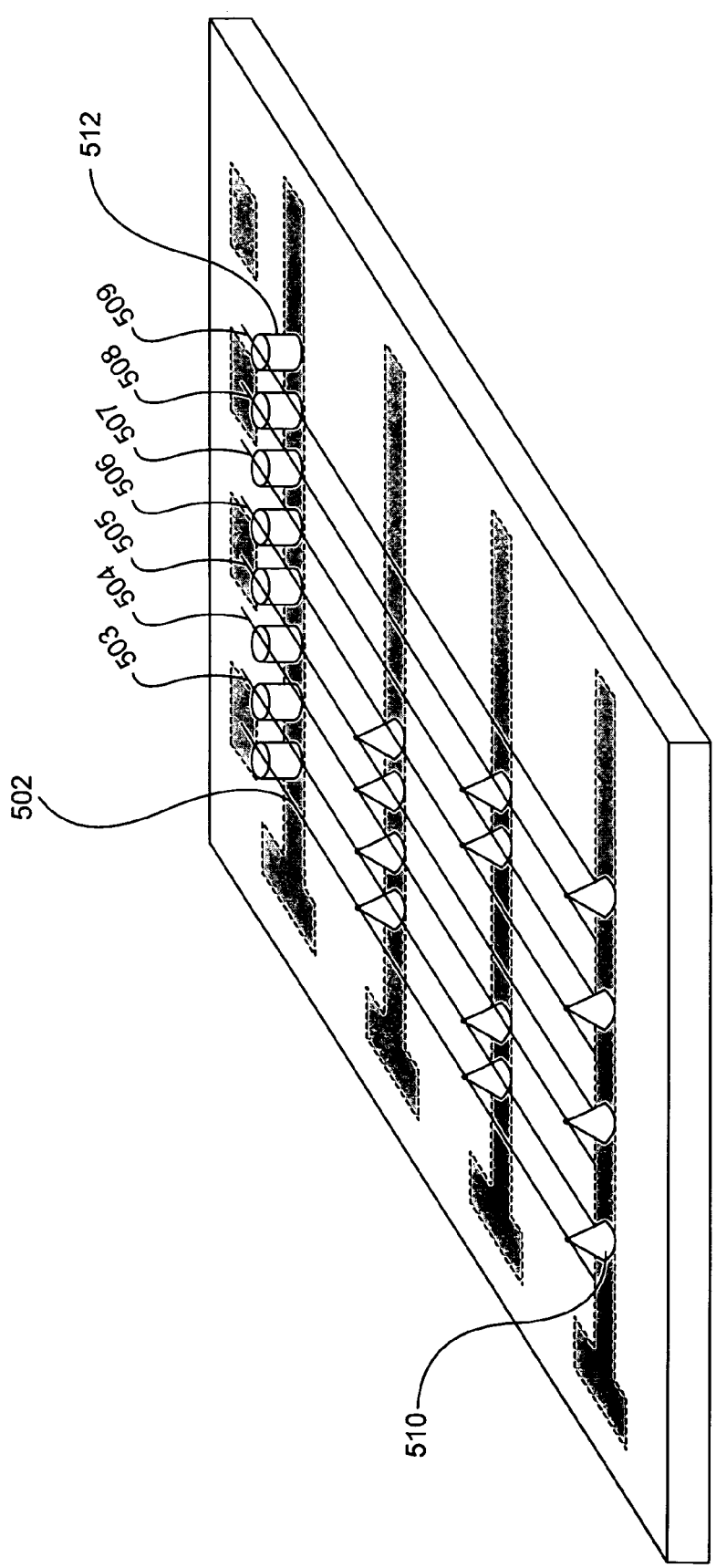
FIG. 5 shows a complete, first demultiplexer layer within the three-dimensional nanoscale memory that represents one embodiment of the present invention.

FIG. 5 shows a complete, first demultiplexer layer within the three-dimensional nanoscale memory that represents one embodiment of the present invention. This next, logical layer comprises a set of eight parallel nanowires 502-509. The nanowires 502-509 are perpendicular to the previously discussed source-voltage line 402 and the three address lines 404, 405, and 406. The nanowires are selectively connected with the address lines 404-406 by diode junctions, represented in FIG. 5, and in subsequent figures, by cone-like elements, such as the diode junction 510 at the intersection between nanowire 502 and address line 406. All eight nanowires 502-509 are interconnected with conductive interconnections, represented in FIG. 5, and in subsequent figures, by short cylindrical sections, such as short cylindrical section 512 representing a conductive connection between nanowire 509 and source-voltage line 402. Depending on the type of crossbar memory implemented, the address lines may be pairs of complementary lines, and the diode junctions shown in FIG. 5, and in subsequent figures, may indicate junctions between the uninverted address line of a pair and the overlying nanowire, with the implication that, where no diode junction is shown, the nanowire is interconnected through a diode to the inverted address line of the pair. In other cases, resistor or transistor junctions are employed. The illustration convention used in FIG. 5, and in subsequent figures, is meant to indicate that appropriate junctions are included in order to provide unique addressability of each nanowire. For example, the pattern of diode junctions shown in FIG. 5 implies that there is a unique, three-bit address for each of the eight nanowires 502-509, making each nanowire uniquely addressable via the address lines 404-406.

The diode junctions and conductive interconnections can be formed by many different possible techniques, including multi-level imprint lithography, application of configuration voltages to address lines and nanowires, by chemical deposition, or by other processes. The diode junctions and interconnect junctions appear, in FIG. 5, to constitute a separate layer between the nanowires 502-509 and the source-voltage and address lines 402 and 406, although, as discussed above, these junctions may be implemented either as a separate coating or layer, or as sheath-like coatings applied to the nanowires and/or address lines, or even elemental or molecular components of the nanowires and/or source-voltage line and address lines.

Figure 1:
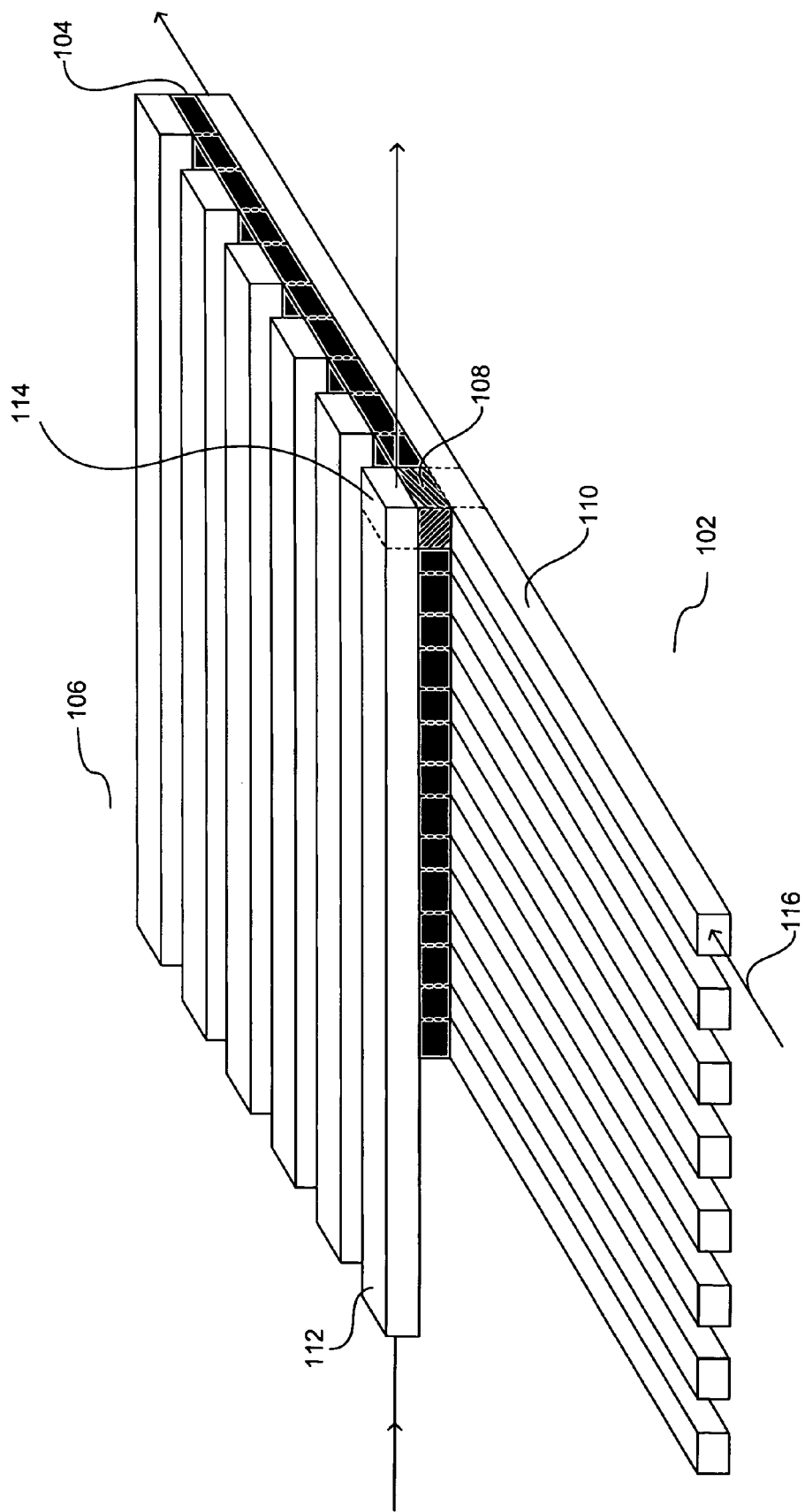
FIG. 1 illustrates an exemplary nanowire crossbar.
Figure 6:
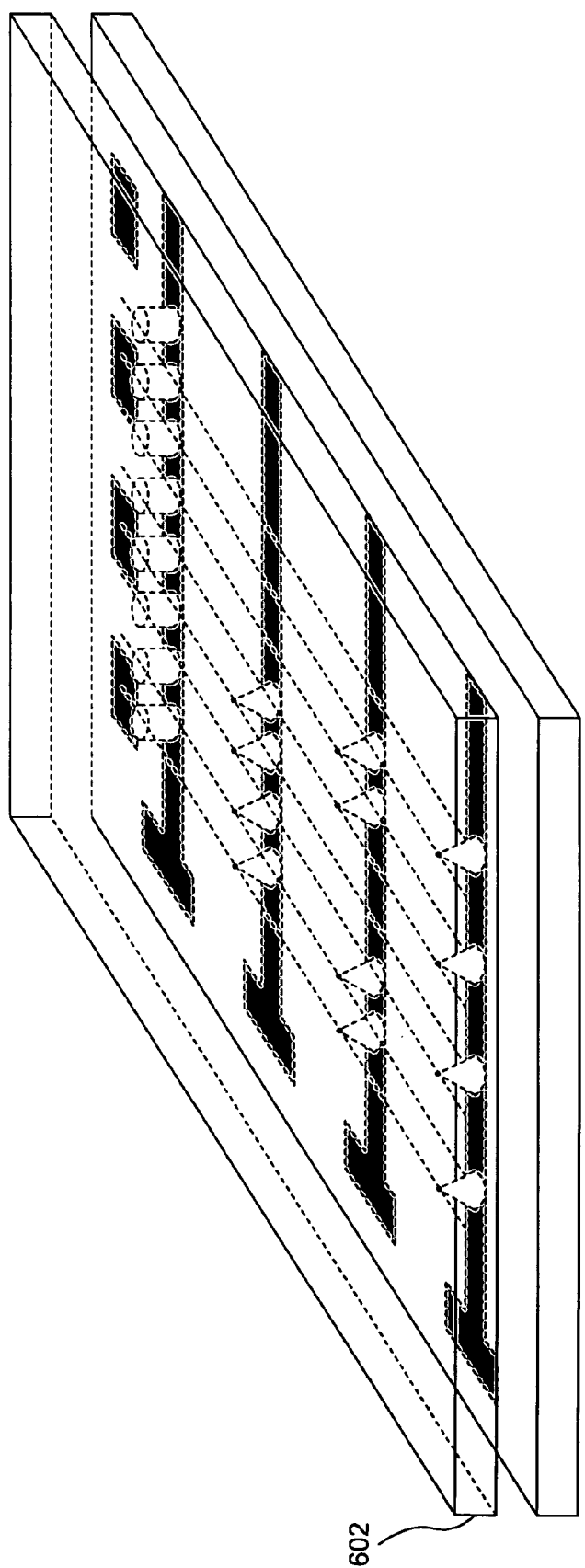
FIG. 6 illustrates a bistable bit-storage layer of the three-dimensional nanoscale memory that represents one embodiment of the present invention.

FIG. 6 illustrates a bistable bit-storage layer of the three-dimensional nanoscale memory that represents one embodiment of the present invention. As shown in FIG. 6, the bistable bit-storage layer 602 has been added above the first demultiplexer layer, discussed with reference to FIG. 5. The bistable bit-storage layer may be implemented as a separate coating or film, or may alternatively be implemented as a coating or sheath applied to the nanowires, or even as elemental or molecular components of the nanowires. The bistable bit-storage layer is generally a bistable layer that allows for stable encoding of bit values in two different, stable, physical states, as discussed above with reference to FIG. 1.

Figure 7:
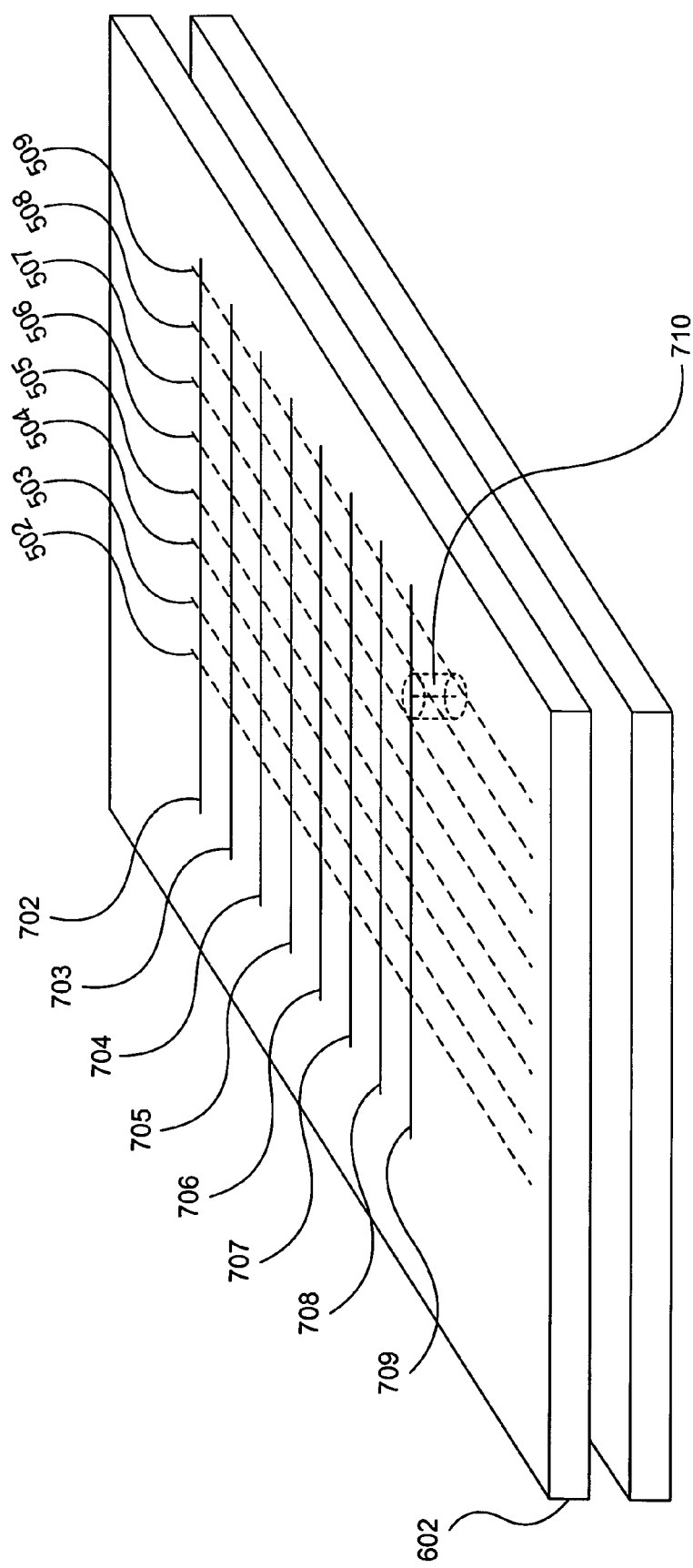
FIG. 7 shows first components of a second demultiplexer layer above the bistable bit-storage layer, discussed above with reference to FIG. 6, of the three-dimensional nanoscale memory that represents one embodiment of the present invention.

FIG. 7 shows first components of a second demultiplexer layer above the bistable bit-storage layer, discussed above with reference to FIG. 6, of the three-dimensional nanoscale memory that represents one embodiment of the present invention. As shown in FIG. 7, eight nanowires 702-709 are implemented, in parallel, across the upper surface of the bistable bit-storage layer 602, perpendicular to the nanowires of the first demultiplexer layer (502-509 in FIG. 5). As discussed above, with reference to FIG. 1, each small region of the bistable bit-storage layer, such as small region 710 at the intersection of nanowire 709, from the second demultiplexer layer, with nanowire 509, from the first demultiplexer layer, serves as a single-bit storage element of the memory.

Figure 8:
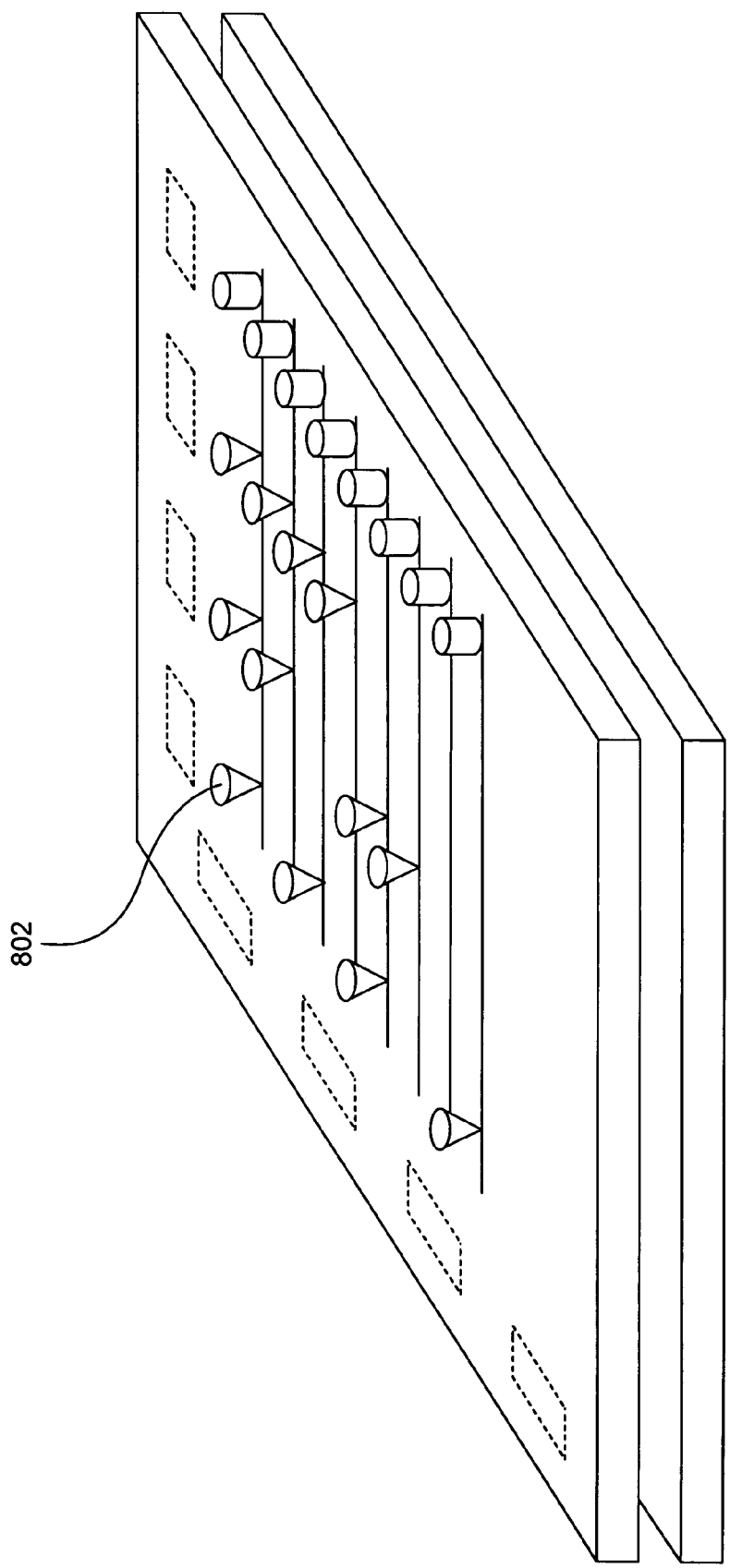
FIG. 8 illustrates nanowire junctions formed to interconnect nanowires of the second demultiplexer layer with a source-voltage line and address lines of the second demultiplexer layer in the three-dimensional nanoscale memory that represents one embodiment of the present invention.

FIG. 8 illustrates nanowire junctions formed to interconnect nanowires of the second demultiplexer layer with a source-voltage line and address lines of the second demultiplexer layer in the three-dimensional nanoscale memory that represents one embodiment of the present invention. These junctions are shown in FIG. 8 as a separate layer, but, as discussed above, may also be implemented by a separating coating, film, or other layer, or by coatings on nanowires and/or address lines, or even by elemental and molecular components of nanowires and/or address lines and the source/voltage line. Note that the pattern of the fabricated diode elements, such as diode element 802, implies unique addressability for each of the eight nanowires (702-709 in FIG. 7).

Figure 9:
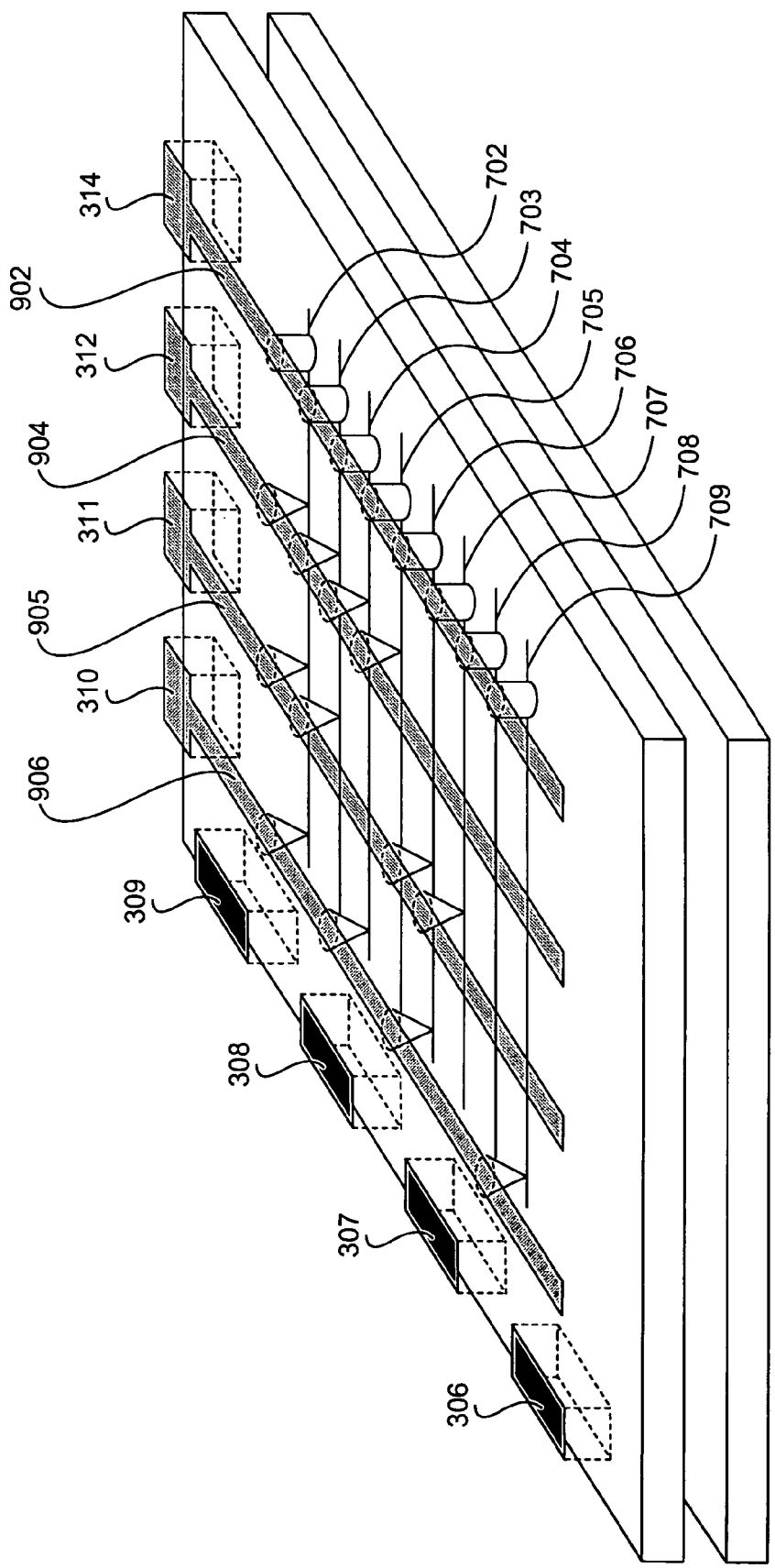
FIG. 9 shows the completed, fully wired, three-dimensional nanoscale memory that represents one embodiment of the present invention.

FIG. 9 shows the completed, fully wired, three-dimensional nanoscale memory that represents one embodiment of the present invention. As shown in FIG. 9, a source-voltage line 902 and three address lines 904-906 have been added to serve as the source-voltage and as three-bit-address carriers to select nanowires based on three-bit, input addresses. The nanowires 702-709, source-voltage line 902, and address lines 904-906 together, with the diode and conductive-interconnect junctions that connect them, comprise the second demultiplexer layer of the nanoscale, three-dimensional memory that represents one embodiment of the present invention. Also note that the contacts 310-313 again appear at the highest level within the nanoscale, three-dimensional memory that represents one embodiment of the present invention. These connects may be assumed either to span the layers of the nanoscale, three-dimensional memory down to the substrate, in certain embodiments, or, in alternative embodiments, may reside on the upper surface to allow interconnection with external signal lines and interfaces. Similar considerations apply to contacts 306-309.

Figure 10:
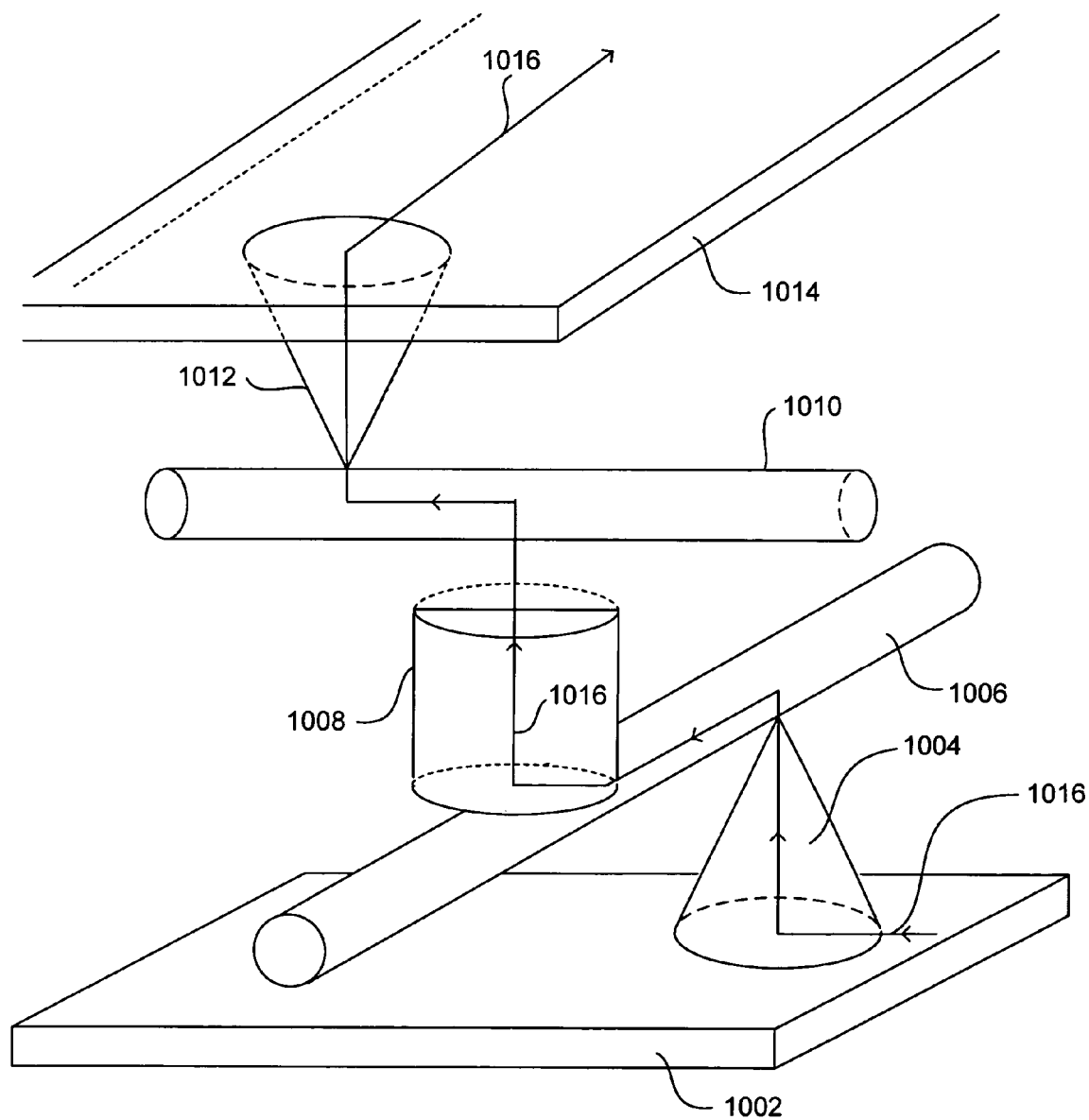
FIG. 10 schematically represents the layers within the complete nanoscale three-dimensional memory that represents one embodiment of the present invention, and shows an exemplary signal path through the layers.

Thus, the complete three-dimensional, nanoscale memory that represents one embodiment of the present invention includes a first demultiplexer layer, a nanoscale-crossbar-memory layer, and a second demultiplexer layer, all stacked one above the other to form a three-dimensional device. FIG. 10 schematically represents the layers within the complete nanoscale three-dimensional memory that represents one embodiment of the present invention, and shows an exemplary signal path through the layers. Signals can pass from a lower-level address line 1002 through a nanowire junction 1004 to a first nanowire 1006, all part of the first demultiplexer layer. From the first nanowire 1006, the signal may pass through a single-bit storage element 1008 to a second nanowire 1010, the bistable-bit-storage layer, along with interfacing nanowires, constituting a second layer within the three-dimensional, nanoscale memory, and from the second nanowire 1010 through a second diode junction 1012 to a second address line 1014 of the second multiplexer layer. Thus, as illustrated by the multi-segment signal path 1016 shown in FIG. 10, non-linear signal paths may traverse the three-dimensional nanoscale memory in a third, vertical dimension, in addition to the two-dimensional horizontal and vertical signal paths encountered in a conventional, crossbar or crossbar-like device with two-dimensional-array-like addressing. The segment of nanowire interconnecting an address line to a nanowire within the three-dimensional nanoscale memory device is significantly shorter, essentially the length of a junction, than in the two-dimensional nanoscale memory device discussed with reference to FIG. 2. Furthermore, the diode and interconnection-like electronic components all occur within the first demultiplexer layer and the second demultiplexer layer, while the memory-bit-storage elements occur within the bistable bit-storage layer of the three-dimensional nanoscale multiplexer. Because different types of junctions can be isolated to different layers within a device, expensive masking and mask alignment steps can be avoided.

Three-dimensional nanoscale circuits and devices of the present invention are three-dimensional in numerous different respects. First, non-linear signal paths can be fabricated in these circuits and devices in three, independent directions, rather than only the two independent directions of the essentially two-dimensional devices such as the nanoscale memory discussed with reference to FIG. 2. For example, in the nanoscale memory shown in FIG. 2, signal paths can be arbitrarily constructed to access a particular location in the plane of the device, but once a location, or single-bit storage element is selected, signals pass only vertically, in a single vertical path segment, through the single-bit storage element. By contrast, as shown in FIG. 10, a signal path can be constructed from multiple, vertical segments in addition to segments in the plane of a particular layer. Second, nanowire junctions can be interconnected together in three, independent directions in the three-dimensional nanoscale circuits and devices, rather than in two directions in the current, essentially two-dimensional circuits and devices. Finally, the three-dimensional devices of the present invention may include an arbitrary number of functionally different layers, each with a different type of nanowire junction or other nanoscale features than in adjoining layers.

Although the present invention has been described in terms of particular embodiments, it is not intended that the invention be limited to these embodiments. Modifications within the spirit of the invention will be apparent to those skilled in the art. For example, the general approach to constructing three-dimensional, multi-layered nanoscale electronic devices discussed above with respect to a three-dimensional nanoscale memory can be applied to construct an essentially limitless number of different types of devices, including programmable arrays, multiplexers, demultiplexers, combined logic and memory circuits, and any number of specialized circuits and devices. Different types of nanoscale, three-dimensional devices and circuits may need different numbers of layers, each layer having different chemical compositions, structures, organizations, and other variable features. As one specific example, a special type of nanowire, referred to as a "cutter wire," can be included in conventional, two-dimensional, nanowire crossbars to allow partitioning of the crossbar by chemically or electronically cutting the cutter wire or cutter wires. Unfortunately, identifying the appropriate cutter wire for a given application, as well as applying the necessary stimulus to cut the cutter wire, can be problematic, and can significantly increase the cost of a device fabricated using cutter wires. By contrast, one or more cutter-wire layers can be included in a multi-layer, three-dimensional nanoscale device, obviating the need for precise identification of individual cutter wires, and specialized masking and mask alignment operations. As discussed above, nanowires, submicroscale and microscale address lines, source-voltage lines, and other components may be fabricated from an almost limitless number of different materials, including elemental metals, metallic alloys, conductive polymers, composite materials, semiconductors, and other conductive or semiconducting materials and compounds. Techniques for fabricating nanowires include self-assembly and transfer from surfaces, in place chemical synthesis, imprint lithography, and other techniques. Techniques for fabricating specific types of nanowire junctions involve depositing particular layers of particular chemical composition, electronically or chemically accessing junctions to configure specific types of nanowire junctions, and other techniques. Different types of junctions may also be fabricated by altering the geometries and distances of nanowire intersections. Three-dimensional nanoscale circuits and devices may be interfaced to, and included within, larger circuits and devices, whether nanoscale, hybrid microscale/nanoscale, or conventional submicroscale or microscale in dimension.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purpose of illustration and description. They are not intended to be exhaustive or to limit the invention to the precise forms disclosed. Obviously many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated.

It is intended that the scope of the invention be defined by the following claims and their equivalents:

The invention claimed is:

1. A three-dimensional nanoscale electronic device comprising:
    a first functional layer including nanowires and a first type of nanowire junction; and
    one or more additional functional layers, layered above the first functional layer, including nanowires and one or more additional types of nanowire junctions, the first functional layer and one or more additional functional layers interconnected, in a direction approximately normal to planes of the first and one or more functional layers, through one or more of nanowires, nanowire junctions, microscale signal lines, and submicroscale signal lines.

2. The three-dimensional nanoscale electronic device of claim 1 wherein signal paths can be fabricated in three independent directions.

3. The three-dimensional nanoscale electronic device of claim 1 wherein the first functional layer and the one or more additional functional layers each contains multiple, parallel nanowires interconnected with additional features through selectively fabricated nanowire junctions.

4. The three-dimensional nanoscale electronic device of claim 3 wherein the additional features include one or more of:
    nanowires;
    microscale wires;
    submicroscale wires;
    contacts; and
    electronic components, including transistors, resistors, diodes, and interconnections.

5. The three-dimensional nanoscale electronic device of claim 1 further including:
    a first demultiplexer layer;
    a nanowire-crossbar memory; and
    a second demultiplexer layer.

6. The three-dimensional nanoscale electronic device of claim 1 further including:
    contacts that allow external signal and source-voltage lines to be interconnected with the three-dimensional nanoscale electronic device.

* * * * *